(12) United States Patent
Schulze et al.

(10) Patent No.: US 6,489,187 B2
(45) Date of Patent: Dec. 3, 2002

(54) METHOD FOR SETTING THE BREAKOVER VOLTAGE OF A THYRISTOR

(75) Inventors: Hans-Joachim Schulze, Ottobrunn (DE); Franz Josef Niedernostheide, München (DE)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 09/935,359

(22) Filed: Aug. 22, 2001

(65) Prior Publication Data

US 2002/0022306 A1 Feb. 21, 2002

Related U.S. Application Data

(63) Continuation of application No. PCT/DE00/00327, filed on Feb. 3, 2000.

(30) Foreign Application Priority Data

Feb. 22, 1999 (DE) ......................................... 199 07 543

(51) Int. Cl.[7] ............................................. H01L 21/332
(52) U.S. Cl. ..................... 438/133; 438/139; 438/798
(58) Field of Search .............................. 438/139, 798, 438/133

(56) References Cited

U.S. PATENT DOCUMENTS

| 4,646,121 A | * | 2/1987 | Ogura | 357/38 |
| 4,987,087 A | * | 1/1991 | Voss | 438/139 |
| 5,420,045 A | * | 5/1995 | Schulze et al. | 437/3 |
| 5,497,010 A | * | 3/1996 | Vogel et al. | 257/113 |
| 6,043,516 A | * | 3/2000 | Schulze | 257/174 |

FOREIGN PATENT DOCUMENTS

| DE | 196 50 762 A1 | 7/1998 |
| EP | 0 297 325 A2 | 1/1989 |
| WO | WO 92/17907 | 10/1992 |
| WO | WO 97/02603 | 1/1997 |
| WO | WO 98/15010 | 4/1998 |
| WO | WO 98/34282 | 8/1998 |

* cited by examiner

*Primary Examiner*—David Nelms
*Assistant Examiner*—Thao Le
(74) *Attorney, Agent, or Firm*—Laurence A. Greenberg; Werner H. Stemer; Ralph E. Locher

(57) ABSTRACT

The effective doping profile of a finished thyristor is altered with helium ions radiated into a region provided for triggering the thyristor in such a way that the breakover voltage for overhead ignition is increased or reduced. Doping profile changes made in the cathode side half of the anode side base provide effective results, e.g. in the vicinity of the pn junction between the anode side and the cathode side base. The helium ions generate acceptor-type states that lower the effective n doping.

4 Claims, 1 Drawing Sheet

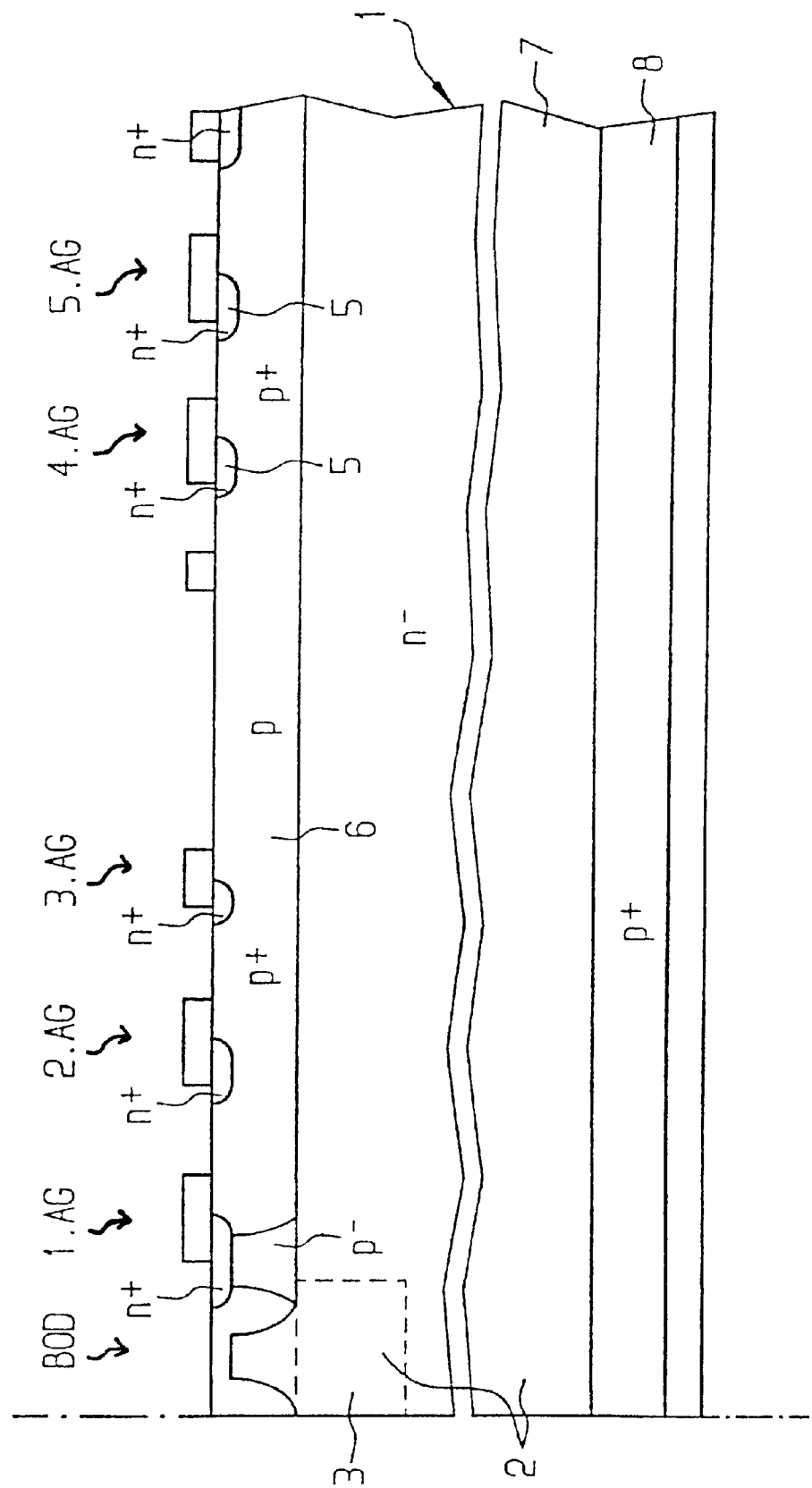

METHOD FOR SETTING THE BREAKOVER VOLTAGE OF A THYRISTOR

CROSS REFERENCE TO RELATED APPLICATION

This application is a continuation of International Application No. PCT/DE00/00327, filed Feb. 3, 2000, which designated the United States.

BACKGROUND OF THE INVENTION

Field of the Invention

The invention relates to a method for setting and for fine-tuning the breakover voltage on thyristors that have already been fabricated.

A thyristor has a semiconductor body which has, in succession, an n-doped cathode-side emitter, a p-doped cathode-side base, a n-doped anode-side base and a p-doped anode-side emitter and whose cathode-side emitter is provided with an electrode serving as a cathode and whose anode-side emitter is provided with an electrode serving as an anode. If an electrical voltage is applied to the anode by the positive pole and to the cathode by the negative pole, the thyristor is in the blocking region (blocking state) for low voltage magnitudes. If the voltage is increased, a current flow in the forward direction is turned on when the (maximum) forward blocking voltage is reached, the so-called breakover voltage, also referred to as trigger voltage. The thyristor is said to trigger. If the voltage is polarized oppositely between anode and cathode, the thyristor is in the blocking region, which is limited by the reverse blocking voltage at which the thyristor breaks down, with the result that a current flows in the reverse direction.

The thyristor can also be triggered in the presence of a voltage in the blocking region. This triggering can be effected by a control current which is applied between the cathode-side base and the cathode-side emitter, and this can be done, for example, via a so-called gate electrode in a region of the semiconductor body provided for this purpose. In the absence of a control current, the triggering can also be effected as so-called breakover triggering by increasing the voltage to the value of the breakover voltage, in addition through the use of a sufficiently steep voltage rise in the blocking direction or by the radiation of light into a region of the semiconductor body formed specially for this purpose, predominantly the cathode-side base.

The breakover voltage is limited by different effects, depending on the configuration of the thyristor. A current flow in the forward direction can be turned on by the electric field at the blocking cathode-side pn junction becoming so large that charge carrier multiplication (avalanche breakdown, avalanche breakover) occurs, or by the space charge zone extending virtually over the entire thickness of the anode-side base and approaching the anode-side emitter to an extent such that the current gain factor of the anode-side transistor formed from the cathode-side base, anode-side base and anodeside emitter becomes large enough to switch the thyristor on (so-called punch-through effect). The doping profiles of the base regions essentially determine which of the two effects leads to a breakover or breakdown.

Published, Non-Prosecuted German Patent Application No. DE 196 50 762 A1 describes a thyristor in which a zone swept over by the space charge zone (depletion zone) in a region provided for breakover triggering is irradiated with α particles or protons in order to modify the profile of the charge carrier lifetime in such a way that the voltage required for breakover triggering is limited and becomes largely temperature-independent in the range of the operating temperatures. In this thyristor, the breakover triggering takes place in a central BOD structure (breakover diode), which is provided for limiting the breakdown voltage.

U.S. Pat. No. 4,987,087 describes a production method for thyristors, in which the otherwise completed thyristor is irradiated with protons whose penetration depth is set to the cathode-side half of the anode-side base. Defects are produced there in this way, which defects act as donors and locally increase the charge carrier concentration in order to lower the breakover voltage. Although the avalanche breakdown voltage is lowered as a result, on the other hand the current gain factor of the anode-side transistor is lowered due to the reduction of the extent of the space charge zone, with the result that controlled lowering of the breakdown voltage is very difficult.

SUMMARY OF THE INVENTION

It is accordingly an object of the invention to provide a method for setting a breakover voltage of a thyristor which overcomes the above-mentioned disadvantages of the heretofore-known methods of this general type and which can be used to set the breakover voltage of completed thyristors.

With the foregoing and other objects in view there is provided, in accordance with the invention, a method for setting a breakover voltage of a thyristor, the method includes the steps of:

providing a thyristor with a semiconductor body having, in succession, an n-doped cathode-side emitter, a p-doped cathode-side base, an n-doped anode-side base and a p-doped anode-side emitter, and the semiconductor body having a given region in which a current flow is triggered if a forward-biased electrical voltage between the anode-side emitter and the cathode-side emitter reaches a breakover voltage; and radiating ions into the given region provided for triggering the current flow and producing, with the ions, defects in a cathode-side half of the anode-side base such that the defects counteract dopant atoms present in the cathode-side half of the anode-side base.

In other words, a method for setting a breakover voltage of a thyristor, which has a semiconductor body having, in succession, an n-doped cathode-side emitter, a p-doped cathode-side base, an n-doped anode-side base and a p-doped anode-side emitter, and in which the semiconductor body contains a region in which a current flow is triggered if a forward-biased electrical voltage between the anode-side and the cathode-side emitter reaches the value of the breakover voltage, wherein ions are radiated into the region provided for triggering and wherein the ions generate defects in a cathode-side half of an anode-side base, and wherein the defects counteract the dopant atoms.

In the method according to the invention, the effective doping profile of the completed thyristor is altered by irradiation with a suitable ion type in a region provided for triggering, e.g. in a BOD (breakover diode) structure, in such a way that the breakover voltage is set, at least within unavoidable tolerances, to a predetermined value. The ion type is chosen such that defects are produced as a result of the radiating-in process in the semiconductor material, which defects counteract the dopant atoms. What are most effective in this case are alterations in the more weakly doped zone, generally the anode-side base and there preferably in the vicinity of the pn junction between the anodeside and cathode-side bases. In particular, helium ions are suitable for the modification of the n-doped base, the helium ions producing acceptor-like states which lower the effective n-type doping in a region in which the helium ions are highly decelerated. The region in which the helium ions are highly decelerated is generally situated just before the maximum penetration depth which can be determined at least approxiamtely.

Accordingly, a preferred mode of the invention includes radiating ions into the anode-side base such that the ions produce defects acting as acceptors in the anode-side base. Also, a preferred mode includes radiating the ions into the anode-side base such that the ions produce defects acting as acceptors in a zone of the anode-side base adjoining the cathode-side base.

According to another mode of the invention, the ions are radiated into a portion of the thyristor including a BOD structure.

Other features which are considered as characteristic for the invention are set forth in the appended claims.

Although the invention is illustrated and described herein as embodied in a method for setting the breakover voltage of a thyristor, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawing.

BRIEF DESCRIPTION OF THE DRAWING

The single FIGURE is a partial, sectional view of a thyristor whose breakover voltage is set according to the method of the invention.

DESCRIPTION OF THE PREFERRED EMBODIMENTS

Referring now to the single FIGURE in detail, there is shown a cross-section of a thyristor in order to explain the method of the invention in an exemplary manner. In order to enlarge the scale, the figure illustrates only half of the cross section of the thyristor. The vertical dash-dotted line depicted on the left-hand side of the FIGURE is a line at which the partial view has to be mirrored for completing the view.

The thyristor has a semiconductor body 1 having, in succession, an n-doped cathode-side emitter 5, a p-doped cathode-side base 6, an n-doped anode-side base 7 and a p-doped anode-side emitter 8. The semiconductor body 1 contains a region 2 in which a current flow is triggered if a forward-biased electrical voltage between the anode-side and cathode-side emitters reaches the value of the breakover voltage of this region. This voltage is applied to the depicted contacts on the top side and underside of the semiconductor body. A series of so-called AG (amplifying gate) structures is depicted, the structures triggering in the order of the depicted numbering when the thyristor triggers. The thyristor is preferably rotationally symmetrical, so that the cross section shown in the figure from left to right represents the thyristor structure from the center towards the outside.

In this example, the central region 2 of the thyristor is configured for triggering through the use of light radiated in. In order to ensure that, in the case of overvoltages in the blocking direction, the thyristor first triggers in the center and the actual triggering of the current flow in the forward direction takes place successively via the AG structures, the region 2 provided for triggering may contain a BOD structure, as is described e.g. in Published, Non-Prosecuted German Patent Application No. DE 196 50 762 A1 cited above. The maximum voltage, which can be reached before the triggering of the thyristor is in this case determined by the avalanche breakdown voltage of the protective diode in the center. The avalanche breakdown voltage critically depends on the curvature properties of the boundary of the central portion of the p-doped region forming the cathode-side base.

What is of importance for subsequent modification of the breakover voltage is, in particular, the fact that a local lowering of the n-type doping in the cathode-side half of the anode-side base, e.g. in the surroundings of the blocking pn junction, brings about a corresponding lowering of the electric field strength there. That leads, on the one hand, to an increase in the avalanche breakdown voltage of the protective diode and, on the other hand, to the space charge zone which forms at the blocking pn junction extending more deeply into the anode-side base given the same anode-cathode voltage. That then brings about an increase in the current gain factor of the pnp transistor formed from the cathode-side base, the anode-side base and the anode-side emitter, and hence in the blocking current.

If, as a result of the subsequent irradiation, the effective doping is reduced only in a small cathode-side zone 3 of the anode-side base 7 and not excessively greatly, then that has only a minor effect on the current gain factor of the pnp transistor given a sufficiently long length of the anode-side base (sufficiently large thickness of the n-doped semiconductor layer forming the anode-side base). Thus, on account of the increase in the avalanche breakdown voltage of the protective diode, the lowering of the maximum field strength at the blocking pn junction leads to a corresponding increase in the breakover voltage of the thyristor. By contrast, greatly lowering the effective n-type doping in the anode-side base within a relatively large region causes the breakover voltage to be lowered, since the influence on the current gain factor then predominates. In this case, the space charge zone approaches the anode-side emitter 8 long before the avalanche breakdown voltage of the blocking pn junction is reached in the region 2 provided for triggering.

The local lowering of the effective doping concentration in the anode-side base which is necessary for the desired application can be achieved by preferably cathode-side irradiation of the thyristor in the central region 2 provided for triggering, for example using helium ions. The irradiation energy is set at a sufficient level in accordance with the required penetration depth. This irradiation produces acceptor-like states, which reduce the effective n-type doping. An analogous reduction of a p-type doping can be achieved, for example, through the use of irradiation with protons, as is described using a different kind of application in U.S. Pat. No. 4,987,087 cited above. The process of irradiation with particles additionally leads to the production of defects in the semiconductor material, preferably silicon, which bring about a lowering of the generation lifetime and thus a local rise in the leakage current on account of the increased density of free charge carriers. This results in a further reduction of the breakover voltage. It is advantageous here that the influence on the total leakage current is small if only small volumes are irradiated in the semiconductor material. Breakover voltage increases and also decreases can be realized in a simple and comparatively accurate manner by the method according to the invention.

The extent to which the breakover voltage is lowered or raised can be set by way of the dose and the energy of the irradiation. Repeated irradiation with different energies allows the effective doping of the anode-side base to be modified in a targeted manner in regions having dimensions of hundreds of micrometers. The defects produced are preferably annealed by heat treatment at temperatures around 250° C., in order to prevent electrical instabilities. Such a process step can quite safely be performed with an otherwise completed thyristor.

We claim:

1. A method for setting a breakover voltage of a thyristor, the method which comprises:

providing a thyristor with a semiconductor body having, in succession, an n-doped cathode-side emitter, a p-doped cathode-side base, an n-doped anode-side base and a p-doped anode-side emitter, and the semiconductor body having a given region in which a current flow is triggered if a forward-biased electrical voltage between the anode-side emitter and the cathode-side emitter reaches a breakover voltage; and radiating helium ions into the given region provided for triggering the current flow and producing, with the helium ions, defects in a cathode-side half of the anode-side base such that the defects counteract dopant atoms present in the cathode-side half of the anode-side base.

2. The method according to claim 1, which comprises radiating ions into the anode-side base such that the ions produce defects acting as acceptors in the anode-side base.

3. The method according to claim 1, which comprises radiating the ions into a zone of the anode-side base adjoining the cathode-side base such that the ions produce defects acting as acceptors in the zone of the anode-side base adjoining the cathode-side base.

4. The method according to claim 1, which comprises:

providing a BOD structure in a portion of the thyristor; and radiating the ions into the portion of the thyristor including the BOD structure.

* * * * *